(12) United States Patent
Pettitt

(10) Patent No.: US 6,342,898 B1
(45) Date of Patent: Jan. 29, 2002

(54) COMPRESSION AND DECOMPRESSION OF DEGAMMA TABLES FOR PROJECTION SYSTEMS

(75) Inventor: Gregory S. Pettitt, Rowlett, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/270,172

(22) Filed: Mar. 16, 1999

Related U.S. Application Data

(60) Provisional application No. 60/078,118, filed on Mar. 16, 1998.

(51) Int. Cl.[7] .................................................. G09G 5/00
(52) U.S. Cl. ........................ 345/601; 345/601; 345/602; 345/600; 382/254
(58) Field of Search ................................ 345/601, 602, 345/589, 590; 382/275, 254

(56) References Cited

U.S. PATENT DOCUMENTS

| | | | | |
|---|---|---|---|---|
| 5,012,163 A | * | 4/1991 | Alcorn et al. ................ | 315/383 |
| 5,623,281 A | * | 4/1997 | Markandey et al. ........ | 345/108 |
| 5,726,718 A | * | 3/1998 | Doherty et al. ............. | 348/771 |
| 5,880,702 A | * | 3/1999 | Morimoto et al. ............. | 345/1 |
| 6,040,876 A | * | 3/2000 | Pettitt et al. ................ | 348/624 |
| 6,052,491 A | * | 4/2000 | Clatanoff et al. ........... | 382/275 |
| 6,215,913 B1 | * | 4/2001 | Clatanoff et al. ........... | 382/275 |

* cited by examiner

*Primary Examiner*—Matthew Luu
*Assistant Examiner*—Daniel J Chung
(74) *Attorney, Agent, or Firm*—Charles A. Brill; Wade James Brady, III; Frederick J. Telecky, Jr.

(57) ABSTRACT

A method and system for compressing and decompressing degamma data stored in a read only memory (116). A control processor (114) reads the compressed degamma data from the ROM (116) and decompresses the degamma data. The decompressed data is stored in a set of random access memory degamma lookup tables (118).

16 Claims, 1 Drawing Sheet

COMPRESSION AND DECOMPRESSION OF DEGAMMA TABLES FOR PROJECTION SYSTEMS

This application claims priority under 35 USC § 119(e)(1) of provisional application No. 60/078,118 filed Mar. 16, 1998.

FIELD OF THE INVENTION

This invention relates to the field of display systems, more particularly to display systems using gamma correction.

BACKGROUND OF THE INVENTION

Micromechanical devices are small structures typically fabricated on a semiconductor wafer using techniques such as optical lithography, doping, metal sputtering, oxide deposition, and plasma etching which have been developed for the fabrication of integrated circuits.

A digital micromirror device (DMDs), sometimes referred to as a deformable micromirror device, is a type of micromechanical device. Other types of micromechanical devices include accelerometers, pressure and flow sensors, gears and motors. While some micromechanical devices, such as pressure sensors, flow sensors, and DMDs have found commercial success, other types have not yet been commercially viable.

Digital micromirror devices are primarily used in optical display systems. In display systems, the DMD is a light modulator that uses digital image data to modulate a beam of light by selectively reflecting portions of the beam of light to a display screen. While analog modes of operation are possible, DMDs typically operate in a digital bistable mode of operation and as such are the core of the first true digital full-color image projection systems.

Although DMD-based display systems offer excellent image fidelity, use of the DMD requires existing video sources to be adapted for display on a DMD-based display. For example, broadcast video signals are adapted for display by a cathode ray tube (CRT). Since the intensity response of a CRT is not linear, the intensity component of a broadcast signal is adjusted to compensate for the CRT response. This compensation is generally called gamma correction or gamma compensation. CRT-ready video signals displayed on a non-CRT display, for example on LCD or DMD-based display systems, have artificial intensity levels. To avoid the image distortion caused by the artificial intensity levels, the intensity level of the video signal must be compensated prior to display on a non-CRT-based display system.

Gamma correction may be performed by calculating a corrected image data value for each input gamma-adjusted image data value using a degamma equation. Because calculating a corrected value for each image data value demands a lot of processing power, gamma correction is typically performed by translating a gamma-adjusted input image data value to a gamma corrected output value by the use of translation tables, or lookup tables. Each translation table requires a separate location for each possible input value. The input data value is used as an address or offset into the translation table, and the data value stored in the addressed location is the corrected data word.

Many display systems are designed to operate in several modes. For example, some display systems are required to accept NTSC and PAL broadcast input signals, as well as computer generated RGB formats. Separate degamma translation tables typically are used for each video signal component in each video mode further increasing the storage capacity required just to store the degamma compensation tables. Furthermore, the degamma translation tables used for each RGB degamma component often is unique. Using unique RGB degamma translation tables facilitates color correction of the video image data.

The degamma data is generally stored in a non-volatile memory, typically a read only memory (ROM) included in a control processor integrated circuit, and transferred to a random access memory (RAM) lookup table when the display system is powered up. The large amount of memory required simply to store the necessary degamma translation information begins to tax the storage abilities of the control processor's on-board ROM. A method and system to reduce this storage burden is needed.

SUMMARY OF THE INVENTION

Objects and advantages will be obvious, and will in part appear hereinafter and will be accomplished by the present invention which provides a method and system for minimizing the storage capacity required to store the degamma information. One embodiment of the claimed invention provides a method of decompressing a degamma translation table. The method comprising the steps of reading a series of compressed degamma values from a list, calculating a decompressed degamma value for each compressed degamma value in said list using the equation:

$$ucgam(i)=cgam(i)-offset+2*ucgam(i-1)-ucgam(i-2)$$

where ucgam is the decompressed degamma value, cgam is the compressed degamma value, and offset is an optional offset value.

According to another embodiment of the disclosed invention, a method of compressing a degamma translation table is provided. The method comprising the steps of: providing a list of gamma correction words, each gamma correction word occupying a position in the list of gamma correction words and representing a gamma corrected data word for an input word having a value equivalent to the position of the gamma correction word, calculating a compressed value corresponding to each gamma correction word in said list of gamma correction words by utilizing a corresponding gamma correction word, a prior gamma correction word, and a twice-prior gamma correction word. The calculating step comprising, for each compressed value, initializing an interim compressed value, adding the gamma correction word to the interim compressed value, subtracting two times the prior gamma correction word from the interim compressed value, adding the twice-prior gamma correction word to the interim compressed value, and setting the compressed value equal to the interim compressed value.

According to yet another embodiment of the disclosed invention, a display system is disclosed. The display system is comprised of a display device and a video processor for receiving image data from a data source and outputting display data to the display device. The control processor comprises a non-volatile memory storing at least one set of compressed degamma data and a random access memory. The video processor reads the compressed degamma data from the non-volatile memory, decompresses the compressed degamma data, and stores the decompressed degamma data in the random access memory, the decompression performed using the equation:

$$ucgam(i)=cgam(i)-offset+2*ucgam(i-1)-ucgam(i-2)$$

where ucgam is the decompressed degamma value, cgam is the compressed degamma value, and offset is an optional offset value.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION OF THE PREFERRED EMBODIMENTS

A new degamma table compression and decompression technique has been developed that substantially reduces the non-volatile memory required to store degamma and other tables. Since the degamma tables are generally monotonically increasing, a second derivative compression scheme is used to reduce the data storage requirements.

Figure 1:
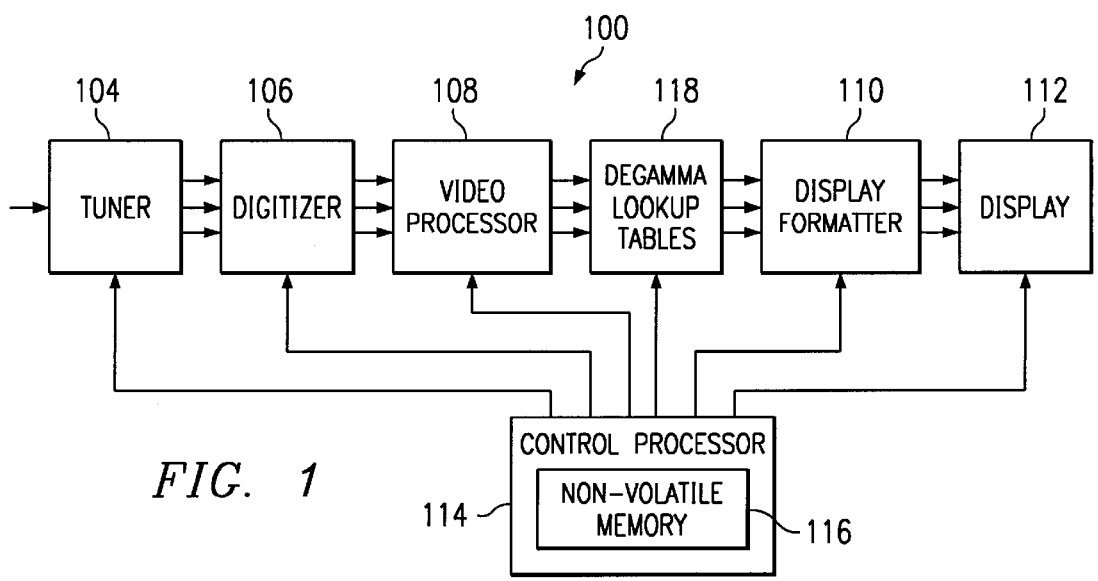
FIG. 1 is a block diagram of a portion of a digital display system.

FIG. 1 is a block diagram of a portion of a digital display system 10. In FIG. 1, tuner 104 receives a radio frequency (RF) television broadcast signal 102. Tuner 104 down-converts the television broadcast signal 102 and separates the down-converted signal into luminance (Y) and chrominance components (Cr, Cb).

After the television broadcast signal has been down-converted and separated, the image signal components are digitized by one or more analog-to-digital converters in digitizer 106. If necessary, the digital image signal is decoded or decompressed by video processor 108, which extracts image data from an encoded image signal. For example, the television broadcast signal 102 may be compressed using industry standard MPEG or Px64 compression schemes or any other encoding or compression scheme. Video processor 108 also converts the luminance (Y) and chrominance (Cr Cb) portions of the decoded digital data into a red (R), green (G), and blue (B) component image signal (RGB) and performs any other image processing required. The RGB component image signal then is processed through the degamma lookup table to remove the CRT encoding. Data formatter 110 converts the RGB data into bit-planes suitable for display on the DMD display device 112.

The digital display system 100 shown in FIG. 1 is for illustration purposes only and not for purposes of limitation. The invention described herein is equally applicable to many other display systems. For example, the system of FIG. 1 could easily be modified to receive a baseband signal or component image signal depending on the desired image source—potentially eliminating the need for the tuner 104, digitizer 106 and most of the functions of the video processor 108. Other embodiments of display system 100 drive other non-CRT displays. For example, data formatter 110 may include digital-to-analog converters to enable the display system to drive a liquid crystal display (LCD) panel.

Figure 2:
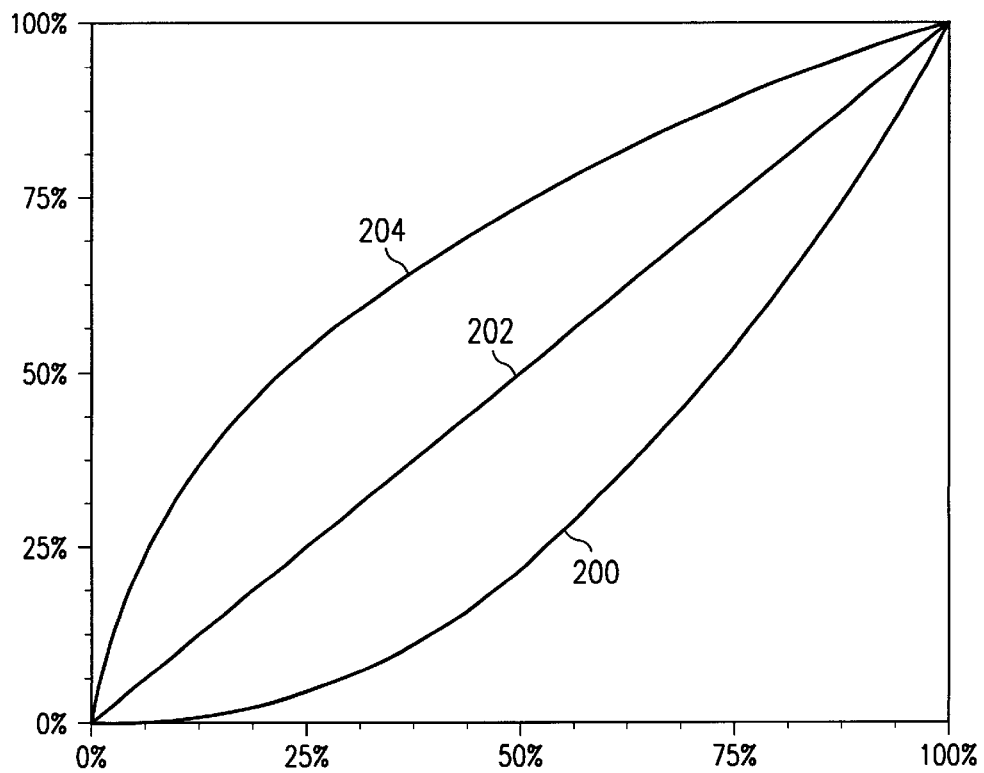
FIG. 2 is a display response function of a CRT display, a television broadcast signal, and a linear display device.

One typical function of the video processor 108 is to map the intensity of the video signal to match the response of the display device. FIG. 2 shows the display response function of a CRT display 200, a television broadcast signal 204, and a linear display device 202 such as a DMD. In FIG. 2, the input signal magnitude is along the horizontal axis and the output signal magnitude is along the vertical axis. Each axis is labeled as a percentage of full scale.

As shown in FIG. 2, a typical CRT display response function 200 is approximately equal to $Y=X^{2.2}$. This non-linear response distorts images from a linear source. Rather than include circuitry to compensate for this non-linear response in every television sold, television broadcast systems adjust the broadcast signal transmission to compensate for the non-linear response. To compensate for the CRT response function, television broadcast systems use a television broadcast signal response function 204 to map a linear input signal to a non-linear output signal which, when displayed by a CRT accurately represents the input image.

If the image signal is to be displayed on a display device 112 that has a linear luminance transfer function, or any transfer function different from that of a CRT, the image signal must be processed to remove the gamma compensation. The degamma compensation ideally is performed prior to digitizing the image signal. However, an accurate analog degamma converter may increase the cost and complexity of the system. Furthermore progressive scan conversion and other digital video processing are performed using digital data in luminance/chrominance format. Therefore, to minimize the system cost, the image data typically is digitized and processed in luminance/chrominance data format before being converted to RGB format. The degamma function, which is used to remove the gamma compensation from the digitized image signal, is performed using the processed RGB data.

The degamma function is typically performed using a lookup table as part of a flowthrough signal path. The lookup table, typically a memory cell array, contains the degamma compensation function data. When component image data is applied as an address or offset to the input of the memory array, the compensation data stored in the addressed location is output from the table. In order to avoid creating image artifacts during the degamma conversion process, the output of the degamma tables typically requires a higher resolution than the input to the degamma tables. For example, a typical degamma table receives an eight-bit input word to select and output a thirteen-bit output word. Once the data is loaded in the memory array no processor intervention is required and the degamma lookup table is able to process image data at a very high data rate.

To enable this high-speed data conversion, three separate degamma lookup tables are used, one for each color component of the RGB signal. Although each of the three tables could contain the same translation data, the degamma function data for each color is typically unique to allow the degamma function lookup table to perform color correction for the display. Furthermore, a unique set of RGB degamma tables is used for each different input video mode.

When the display system is initially turned on, and after any mode change, the degamma tables are loaded into the degamma lookup tables. A control processor 114, which monitors the user interface and controls and configures the rest of the display system, reads the degamma function data from a non-volatile storage memory and stores the data in the degamma lookup tables.

The non-volatile storage memory used to store the degamma function data is typically fabricated in the control processor 114 integrated circuit and typically has a relatively small capacity. A typical control processor 114 is shown in FIG. 3. The non-volatile storage memory included in the control processor 114 must also store the control processor's program code. Since the program code and degamma function table both must be stored in such a limited memory space, it is extremely advantageous to reduce the storage demands of the degamma function data.

The word size of the degamma function data also complicates the storage problem. As mentioned above, the degamma function data is often thirteen-bit words. Since the typical control processor 114 stores and accesses each degamma value as a sixteen bit double word, the prior art method of storing the degamma function data (e.g. as thirteen-bit words in a sixteen-bit space), wasted much of the non-volatile memory. By compressing the multiple degamma tables stored in the on-board ROM, a significant amount space is made available in the processor's on-board ROM.

According to one embodiment of the present invention, shown in FIG. 3, degamma data is stored in a compressed format in a ROM 116 included as part of a control processor 114 integrated circuit. The compressed format requires very little processing power to decompress and store in useable format in the RAM degamma lookup tables 118.

The preferred compression method is based on the realization that degamma data is generally monotonically increasing. Since the degamma data is generally monotonically increasing, the degamma data is stored as the second derivative of the actual degamma data using the equation:

$$cmpgam(i)=(gam(i)-2*gam(i-1)+gam(i-2))+offset$$

| where: | cmpgam | = compressed degamma output |
|---|---|---|
| | gam | = uncompressed degamma, and |
| | offset | = a value used to avoid negative cmpgam values. |

The value of offset is selected to control the range of compressed degamma values and to avoid negative numbers. While most of the compressed degamma values fall within a relatively narrow range, a few of the compressed degamma values will require additional bits to express. It is advantageous to select a compressed word size that allows multiple compressed values to fit evenly within the sixteen-bit data word boundaries and to process the few compressed degamma values outside this narrow range as exceptions. Although any compressed word size is possible, the complexity of the decompression code increases when it is necessary to piece together portions of multiple words to form a single compressed data word. Therefore, the value of offset is selected to maximize the number of compressed words that can be expressed by a number of bits which can be efficiently packed into the sixteen-bit words stored in the non-volatile memory of the control processor 114.

Setting offset equal to eight limits the range of most cmpgam values to between zero and fifteen—a range requiring only four bits of storage. Since only four bits are required to store the compressed degamma values, four values are stored in each sixteen-bit double word—achieving a compression factor of 75%. Compressed gamma values above fifteen and below zero cannot be expressed using only four bits and require the decompression routine to compensate for the limited word size of the compressed degamma values. One way to store degamma tables with compressed values larger than the standard four bits is to create a list of compensation values at the beginning of the compressed degamma table. For example, one embodiment of the present invention uses the following format to store two compensation values:

dword1, dword2, dword3, dword4, dword5, dword6 where: dword1 is the number of compensation values dword2 is the location of the first compensation value (if required)

dword3 is the first compensation value (if required)

dword4 is the location of the second compensation value (if required)

dword5 is the second compensation value (if required), and dword6 is the first four compressed degamma values.

In the above example, the number, location, and value of each compensation value are stored as sixteen-bit double words. Alternate embodiments store the compensation values, or the locations of the compensation values, as bytes within the sixteen-bit double words—thus packing two eight-bit values within a single sixteen-bit double word. Since most degamma tables use input words larger than 8 bits (256 locations), and since generally only one or two compensation values are required, attempting to pack multiple locations or compensation values into a single sixteen-bit double word greatly increases the compensation program code while saving only one or two memory locations. Storing each compensation value and location as a separate sixteen-bit word is reasonably efficient and simplifies the decompression code.

A typical degamma table is shown in Table 1 below. Table 1 contains 256 values and is used to convert an 8-bit input word to a 12-bit output word. Each of the 12-bit output words is stored as a double word, so the entire table requires 512 bytes of both non-volatile and RAM memory.

TABLE 1

| %0 | %0 | %0 | %0 | %0 | %0 | %0 | %1 |
|---|---|---|---|---|---|---|---|
| %1 | %2 | %3 | %5 | %6 | %8 | %A | %B |
| %D | %F | %11 | %13 | %15 | %16 | %18 | %1A |
| %1C | %1E | %20 | %22 | %24 | %26 | %28 | %2A |
| %2C | %2E | %30 | %32 | %35 | %37 | %39 | %3C |
| %3E | %41 | %44 | %46 | %49 | %4C | %4F | %52 |
| %56 | %59 | %5C | %60 | %64 | %68 | %6B | %70 |
| %74 | %78 | %7C | %81 | %86 | %8B | %90 | %95 |
| %9A | %A0 | %A5 | %AB | %B1 | %B8 | %BE | %C5 |
| %CB | %D2 | %D9 | %E1 | %E8 | %F0 | %F8 | %100 |
| %109 | %111 | %11A | %123 | %12D | %136 | %140 | %14A |
| %154 | %15F | %16A | %175 | %180 | %18C | %198 | %1A4 |
| %1B0 | %1BD | %1CA | %1D7 | %1E5 | %1F3 | %201 | %20F |
| %21E | %22D | %23D | %24C | %25C | %26D | %27D | %28E |
| %2A0 | %2B2 | %2C4 | %2D6 | %2E9 | %2FC | %30F | %323 |
| %337 | %34C | %361 | %376 | %38C | %3A2 | %3B9 | %3D0 |
| %3E7 | %3FE | %417 | %42F | %448 | %461 | %47B | %495 |
| %4B0 | %4CB | %4E6 | %502 | %51E | %53B | %558 | %576 |
| %594 | %5B3 | %5D2 | %5F1 | %611 | %632 | %653 | %674 |
| %696 | %6B9 | %6DC | %6FF | %723 | %747 | %76C | %792 |

TABLE 1-continued

| %7B8 | %7DE | %805 | %82C | %855 | %87D | %8A4 | %8CD |
|------|------|------|------|------|------|------|------|
| %8F4 | %91C | %944 | %96C | %994 | %9BB | %9E3 | %A0A |
| %A32 | %A59 | %A80 | %AA7 | %ACD | %AF2 | %B16 | %B39 |
| %B5B | %B7D | %B9D | %BBD | %BDB | %BF9 | %C16 | %C33 |
| %C4E | %C69 | %C83 | %C9C | %CB5 | %CCD | %CE4 | %CFB |
| %D11 | %D27 | %D3C | %D50 | %D64 | %D78 | %D8B | %D9E |
| %DB0 | %DC2 | %DD4 | %DE5 | %DF6 | %E06 | %E17 | %E27 |
| %E37 | %E46 | %E56 | %E65 | %E74 | %E83 | %E92 | %EA1 |
| %EB0 | %EBF | %ECE | %EDD | %EEC | %EFB | %F0A | %F19 |
| %F28 | %F34 | %F41 | %F4D | %F5A | %F64 | %F6E | %F78 |
| %F82 | %F8C | %F93 | %F9D | %FA7 | %FAF | %FB9 | %FC0 |
| %FCA | %FD2 | %FD7 | %FDE | %FE6 | %FF0 | %FF0 | %FF0 |

Table 2 lists the degamma data from Table 1 in compressed form. As described above, the first portion of the compressed data table contains compensation values. The first double word contains the number of compensation used in the table—in this case only one compensation word is required. The location of the sole compensation value in the decompressed degamma table is stored in the second table location, and the compensation value itself is stored in the third table location. Each of the remaining double word locations in the compressed table stores four compressed values. Thus, the entire compressed degamma table requires only 67 double word storage locations whereas the uncompressed degamma data requires 256 double word locations.

TABLE 2

| %0001 | %00FE | %0076 | %8888 | %8888 | %7989 | %7987 | %9888 | %8798 |
|-------|-------|-------|-------|-------|-------|-------|-------|-------|
| %8888 | %8888 | %8888 | %9789 | %7987 | %9888 | %9789 | %887A | %7889 |
| %8888 | %8979 | %8979 | %7989 | %7988 | %9798 | %9798 | %8988 | %8988 |
| %8988 | %9888 | %9897 | %9979 | %9888 | %9889 | %8988 | %9898 | %88A7 |
| %0909 | %9889 | %8989 | %8988 | %9988 | %9988 | %9899 | %8898 | %A77A |
| %6988 | %8797 | %9788 | %7777 | %7868 | %6878 | %6877 | %8778 | %7877 |
| %8878 | %7887 | %8797 | %8797 | %8888 | %8888 | %8888 | %8597 | %9588 |
| %885B | %86A5 | %B65A | %9A88 | | | | | |

The compressed degamma data is decompressed using the equation:

$$ucgam(i) = (cgam(i) - offset) + 2 \cdot ucgam(i-1) - ucgam(i-2)$$

| where: | ucgram | is the uncompressed degamma data |
|--------|--------|-----------------------------------|
|        | cgam   | is the compressed degamma data    |
|        | ucgam(-1) | is initialized to zero, and    |
|        | ucgam(-2) | is initialized to zero.        |

As discussed above, some compressed degamma values cannot be expressed by the limited number of bits chosen to store the compressed degamma values, and compensation values are stored at the beginning of the degamma function data table to compensate for this limited range of expression. There are several methods of using the stored compensation values. According to one embodiment, represented by the code listing of Table 3, stores the compressed value using an offset value large enough to ensure the compress data is not a negative number. For example, the code of Table 3 uses an offset value of 128 to allow eight-bit compressed degamma values without using negative numbers.

An alternate method of storing and using compensation values stores the uncompressed degamma value in the header of the compressed degamma table and substitutes this uncompressed value for the value determined by the decompression equation.

In addition to compensating for the transfer function of the display device, image data is often shifted and scaled to alter the brightness (or black level) and the contrast of the display system. Altering the black level and the contrast of an image often requires a significant amount of processor throughput to multiply and offset the image data. An advantageous method of performing brightness and contrast adjustment in an all-digital environment scales and offsets the degamma lookup table data. By adjusting the degamma lookup table, processing power is only used during an initial period during which the degamma table is constructed. Once the table is complete, no additional processing power is required to scale and offset the image data until either a display mode change or a change in the brightness or contrast setting. When the display changes modes, or when a viewer alters the brightness or contrast setting, processing power is required to rebuild the degamma table. One method of modifying the degamma table to perform the gamma correction, brightness adjustment and contrast adjustment functions uses the following function to decompress the compressed degamma data:

$$ucgam(i - brightness) = contrast \cdot [(cgam(i) - offset + 2 \cdot ucgam(i-1) - ucgam(i-2)]$$

| where: | contrast | is a value used to scale the degamma values, |
|--------|----------|----------------------------------------------|
|        | brightness | is an offset value applied to the input signal to shift the degamma table, |
|        | ucgam    | is the uncompressed degamma data, and        |
|        | cgam     | is the compressed degamma data.              |

Table 3 is the listing of a program for performing the degamma de-compression. The program shown in Table 3 allows for brightness and contrast adjustment of the de-compressed signal.

TABLE 3

```
Define
    bright          % brightness control
    contrast        % contrast control
    tcomp           % temporary register incrementing through
                      compensation values
    p1              % ucgam (i-1)
    p2              % ucgam (i-2)
    gam             % output de-compressed degamma table
    k               % output address in degamma table
    READ num_comp;  % read in the number of compensation
                      values
for (i=1; 1<=num_comp; i++)
{
    READ addr_comp [i]  % read in the address location of the
                          compensation
    READ val_comp [i]   % read in the value of the compensation
}
tcmp = 1;
p1 = 0;
p2 = 0;
k = 0;
if ( bright < 0 )
{
    for ( i=bright; i<0; i++ )
        { % output is saturated low fill in with zeros
        gam = 0;
        STORE gam, k;
        k++;
        }
}
for ( i=0; i<(256+bright); i++) {
    if ( i>255 ) {
        gam = MAXVAL;    % output is saturated high   fill in with
                                                        max value
        STORE gam, k;
        k++;
    }
    else {
        if ( (tcmp <= ncmp) && (i == acmp [tcmp])) {  % locate
                                                        compensation
                                                        % factors
            READ cgam                                 % get the next
                                                        value
            gam = (vcmp [tcmp] - 128) + p1*2 - p2;    % but use
                                                        compensation
                                                        % value
            tcmp++;
        }
        else   {
            READ cgam
            gam = (cgam-8) + p1*2 - p2;    % normal de-com-
                                             pression scheme
        }
        p2 = p1;        % store off previous values
        p1 = gam;
        gam = gam * cnt;    % apply contrast
        if ( gam > MAXVAL )    ( % limit output to MAXVAL)
            gam = MAXVAL;
        }
        else if ( gam < 0) { % limit output at 0
            gam = 0;
        }
        if ( i >= bright )
            STORE gam, k;
            k++;
    }
}
}
```

Thus, although there has been described to this point a particular embodiment for a method and system for compressing and decompressing degamma data tables and for integrating the decompression and brightness and contrast adjustment processes, it is not intended that such specific references be considered as limitations upon the scope of this invention except insofar as set forth in the following claims. Furthermore, having described the invention in connection with certain specific embodiments thereof, it is to be understood that further modification may now suggest themselves to those skilled in the art, it is intended to cover all such modifications as fall within the scope of the appended claims.

What is claimed is:

1. A method of filling a degamma translation table, said method comprising the steps of:

reading a series of compressed degamma values from a list;

calculating a decompressed degamma value for each compressed degamma value in said list using the equation:

$$ucgam(i)=(cgam(i)-offset)+2*ucgam(i-1)-ucgam(i-2)$$

where ucgam is said decompressed degamma value, cgam is said compressed degamma value, and offset is an optional offset value; and entering said decompressed degamma values in said degamma translation table.

2. The method of claim 1, further comprising the steps of:

reading a compensation value and location pointer, and adjusting said decompressed value indicated by said location pointer.

3. The method of claim 2, wherein said adjusting step comprises replacing said decompressed value and said offset value with said compensation value.

4. The method of claim 2, wherein said adjusting step comprises replacing said decompressed value with a value derived from the equation:

$$ucgam(i)=(comp\_val(i)-comp\_offset)+2*ucgam(i-1)-ucgam(i-2)$$

where ucgam is said decompressed degamma value, comp_val is said compensation value, and comp_offset is an optional offset value used with said compensation value.

5. The method of claim 1, wherein said calculating step uses the equation:

$$ucgam(i-brightness)=(cgam(i)-offset)+2*ucgam(i-1)-ucgam(i-2)$$

where brightness is a value chosen to shift said decompressed data values within said degamma translation table.

6. The method of claim 1, wherein said calculating step uses the equation:

$$ucgam(i)=contrast*[(cgam(i)-offset)+2*ucgam(i-1)-ucgam(i-2)]$$

where contrast is a value chosen to scale said decompressed data values.

7. The method of claim 1, wherein said calculating step uses the equation:

$$ucgam(i-brightness)=contrast*[(cgam(i)-offset)+2*ucgam(i-1)-ucgam(i-2)]$$

where brightness is a value chosen to shift said decompressed data values within said degamma translation table and contrast is a value chosen to scale said decompressed data values.

8. A method of compressing a degamma translation table, said method comprising the steps of:

providing a list of gamma correction words, each gamma correction word occupying a position in said list of gamma correction words and representing a gamma corrected data word for an input word having a value equivalent to the position of said gamma correction word;

calculating a compressed value corresponding to each gamma correction word in said list of gamma correction words by utilizing a corresponding gamma correction word, a prior gamma correction word, and a twice-prior gamma correction word, said calculating step comprising, for each compressed value;
initializing an interim compressed value;
adding said gamma correction word to said interim compressed value;
subtracting two times said prior gamma correction word from said interim compressed value;
adding said twice-prior gamma correction word to said interim compressed value; and
setting said compressed value equal to said interim compressed value.

9. The method of claim 8, further comprising the step of adding an offset value to said interim compressed value prior to said step of setting said compressed value equal to said interim compressed value.

10. The method of claim 8, further comprising the steps of:
determining a maximum compressed value;
locating compressed values above said maximum compressed value; and
storing compensation data for said values above said maximum compressed value.

11. A display system comprising:
a data path for receiving image data from an image source;
a gamma compensation circuit on said data path for translating said received image data;
a display device on said data path, said display device for displaying said translated image data; and
a control processor operable to communicate degamma compensation data to said gamma compensation circuit, said control processor comprising a non-volatile memory storing at least one set of compressed degamma data, wherein said control processor reads said compressed degamma data from said non-volatile memory, decompresses said compressed degamma data, and stores said decompressed degamma data in said random access memory, said decompression performed using the equation:

$$ucgam(i)=cgam(i)-offset+2*ucgam(i-1)-ucgam(i-2)$$

where ucgam is said decompressed degamma value, cgam is said compressed degamma value, and offset is an optional offset value.

12. The method of claim 11, said decompression performed using the equation:

$$ucgam(i-brightness)=(cgam(i)-offset)+2*ucgam(i-1)-ucgam(i-2)$$

where brightness is a value chosen to shift said decompressed data values within said degamma translation table.

13. The method of claim 11, said decompression performed using the equation:

$$ucgam(i)=contrast*[(cgam(i)-offset)+2*ucgam(i-1)-ucgam(i-2)]$$

where contrast is a value chosen to scale said decompressed data values.

14. The method of claim 11, said decompression performed using the equation:

$$ucgam(i-brightness)=contrast*[(cgam(i)-offset)+2*ucgam(i-1)-ucgam(i-2)]$$

where brightness is a value chosen to shift said decompressed data values within said degamma translation table and contrast is a value chosen to scale said decompressed data values.

15. The display device of claim 11, said control processor for:
reading a compensation value and location pointer, and
adjusting said decompressed value indicated by said location pointer.

16. The display device of claim 11, said control processor for:
reading a compensation value and location pointer, and
replacing said decompressed degamma value with said compensation value.

* * * * *